(12) United States Patent
Boscher et al.

(10) Patent No.: US 11,764,151 B2
(45) Date of Patent: Sep. 19, 2023

(54) CONNECTION OF SEVERAL CIRCUITS OF AN ELECTRONIC CHIP

(71) Applicants: STMicroelectronics (Rousset) SAS, Rousset (FR); STMicroelectronics (Grenoble 2) SAS, Grenoble (FR)

(72) Inventors: Samuel Boscher, Grenoble (FR); Yann Rebours, Saint Maximin la Sainte Baume (FR); Michel Cuenca, Septemes les Vallons (FR)

(73) Assignees: STMicroelectronics (Rousset) SAS, Rousset (FR); STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 17/580,055

(22) Filed: Jan. 20, 2022

(65) Prior Publication Data

US 2022/0148962 A1 May 12, 2022

Related U.S. Application Data

(63) Continuation of application No. 16/901,449, filed on Jun. 15, 2020, now Pat. No. 11,264,324.

(30) Foreign Application Priority Data

Jun. 19, 2019 (FR) ...................................... 1906583

(51) Int. Cl.
*H01L 23/528* (2006.01)
*H01L 23/50* (2006.01)
*H01L 23/522* (2006.01)

(52) U.S. Cl.
CPC ............ *H01L 23/528* (2013.01); *H01L 23/50* (2013.01); *H01L 23/5226* (2013.01)

(58) Field of Classification Search
CPC ... H01L 23/528; H01L 23/50; H01L 23/5226; G06F 30/39; G06F 30/394
(Continued)

(56) References Cited

U.S. PATENT DOCUMENTS 7,960,824 B2    6/2011  Katou
8,674,470 B1    3/2014  Or-Bach et al.
(Continued)

FOREIGN PATENT DOCUMENTS

DE    10159216 A1    6/2003
WO     0111688 A1    2/2001

OTHER PUBLICATIONS

INPI Search Report and Written Opinion for priority application, FR 1906583, report dated Feb. 12, 2020 (8 pages).

*Primary Examiner* — Tu-Tu V Ho
(74) *Attorney, Agent, or Firm* — CROWE & DUNLEVY

(57) ABSTRACT

An electronic chip includes a shared strip with first and second spaced apart portions extending along a direction of elongation and an intermediate connecting portion extending between the first and second portions. The second portion is connected to a pad that has a greater surface area than the second portion. The first portion is formed by a first plurality of metallic strips. Metallic strips of the first plurality of metallic strips that are adjacent and side by side are separated by a distance smaller than a width of those metallic strips. The second portion is formed by a second plurality of metallic strips. Metallic strips of the second plurality of metallic strips that are adjacent and side by side are separated by a distance smaller than a width of those metallic strips.

31 Claims, 2 Drawing Sheets

(58) Field of Classification Search
USPC .......................................................... 257/774
See application file for complete search history.

(56) References Cited

U.S. PATENT DOCUMENTS

| | | | |
|---|---|---|---|
| 11,264,324 B2* | 3/2022 | Boscher | .................. G06F 30/39 |
| 2007/0246827 A1 | 10/2007 | Owa | |
| 2010/0072625 A1 | 3/2010 | Katou | |
| 2013/0073878 A1 | 3/2013 | Jayasimha et al. | |
| 2016/0372182 A1* | 12/2016 | Liaw | ...................... B81B 3/0051 |
| 2018/0151496 A1 | 5/2018 | Biswas et al. | |

\* cited by examiner

CONNECTION OF SEVERAL CIRCUITS OF AN ELECTRONIC CHIP

PRIORITY CLAIM

This is a continuation of U.S. patent application Ser. No. 16/901,449, filed on Jun. 15, 2020, which claims the priority benefit of French Application for Patent No. 1906583, filed on Jun. 19, 2019, the contents of which are hereby incorporated by reference in their entireties to the maximum extent allowable by law.

TECHNICAL FIELD

The present disclosure relates generally to electronic devices and, in particular, to integrated circuit electronic chips.

BACKGROUND

Certain electronic devices, such as an integrated circuit electronic chip, receive and/or supply potentials on contact pads connected to one or several other devices. For example, an electronic chip is linked to a supply source and receives a supply voltage. The potentials are then distributed to various electronic circuits located in the chip.

There is a need in the art to addresses all or some of the drawbacks of known electronic chips.

SUMMARY

Disclosed herein is an electronic chip, including: a shared strip that is at least partially conductive and is linked to a node for applying a fixed potential, wherein the shared strip comprises a plurality of metallic strips, wherein metallic strips that are adjacent and side by side are separated by a distance smaller than a width of the metallic strips.

The shared strip may be electrically conductive along a direction of elongation, and may have a ratio of length to width greater than 50, the length being along the direction of elongation, the width being orthogonal to the direction of elongation.

The shared strip may be electrically conductive along a direction of elongation, and may have a ratio of length to width greater than 10, the length being along the direction of elongation, the width being orthogonal to the direction of elongation.

The shared strip may be electrically conductive along a direction of elongation, and may have a ratio of length to width greater than 2, the length being along the direction of elongation, the width being orthogonal to the direction of elongation.

The shared strip may be devoid of curves or angles along the direction of elongation.

The shared strip may be formed by a first portion extending along the direction of elongation, a second portion extending along the direction of elongation, and an intermediate connection portion connecting the first portion to the second portion, the intermediate connection portion being orthogonal to the direction of elongation.

The shared strip may have at least one curve or angle along the direction of elongation.

The node may be defined by a connection pad of the electronic chip.

A plurality of tracks may extend from the shared strip, with a resistance per unit length of the shared strip being lower than a resistance per unit length of the plurality of shared tracks.

The plurality of tracks may be located in a different layer than the shared strip and connected to the shared strip by vias.

A sum of the widths of the plurality of metallic strips forming the shared strip may be greater than a width of the tracks.

A sum of the thicknesses of the plurality of metallic strips comprising the shared strip may be greater than that of each track.

At least some of the plurality of metallic strips may be located in different metal levels and at least partially superimposed and connected by vias.

The distance may be less than 30% of the width of the plurality of metallic strips.

Also disclosed herein is an electronic chip, including: a shared strip comprising a first portion extending along a direction of elongation, a second portion extending along the direction of elongation and laterally spaced apart from the first portion, and an intermediate connecting portion extending between the first portion and second portion; and a pad to which the second portion is connected, the pad having a greater surface area than the second portion. The first portion is formed of a first plurality of metallic strips, wherein metallic strips of the first plurality of metallic strips that are adjacent and side by side are separated by a distance smaller than a width of those metallic strips. The second portion is formed of a second plurality of metallic strips, wherein metallic strips of the second plurality of metallic strips that are adjacent and side by side are separated by a distance smaller than a width of those metallic strips.

The intermediate connecting portion may extend orthogonally to the direction of elongation.

The shared strip may have a ratio of length to width greater than 2.

A plurality of tracks may extend from the shared strip, with a resistance per unit length of the shared strip being lower than a resistance per unit length of the plurality of shared tracks.

The plurality of tracks may be located in a different layer than the shared strip and connected to the shared strip by vias.

At least some of the plurality of metallic strips may be located in different metal levels and at least partially superimposed and connected by vias.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, the operations and elements that are useful for an understanding of the embodiments described herein have been illustrated and described in detail. In particular, the electronic chip circuits are not described in detail, the described embodiments being compatible with the usual electronic chip circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

Figure 2:
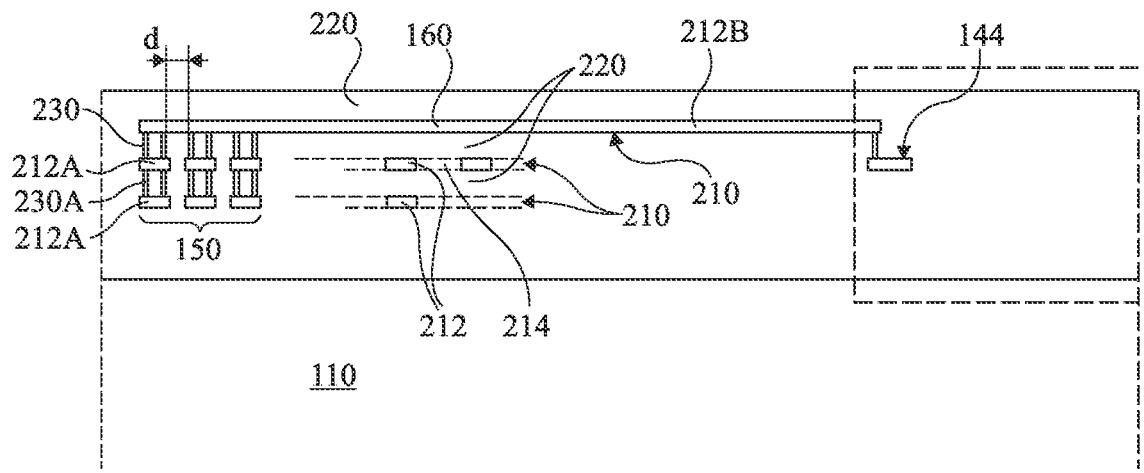
FIG. 2 schematically shows a sectional view of the chip of FIG. 1, on a different scale from that of FIG. 1.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in FIG. 2.

Unless specified otherwise, the expressions "around", "approximately", "substantially" and "in the order of" signify within 10%, and preferably within 5%.

Figure 1:
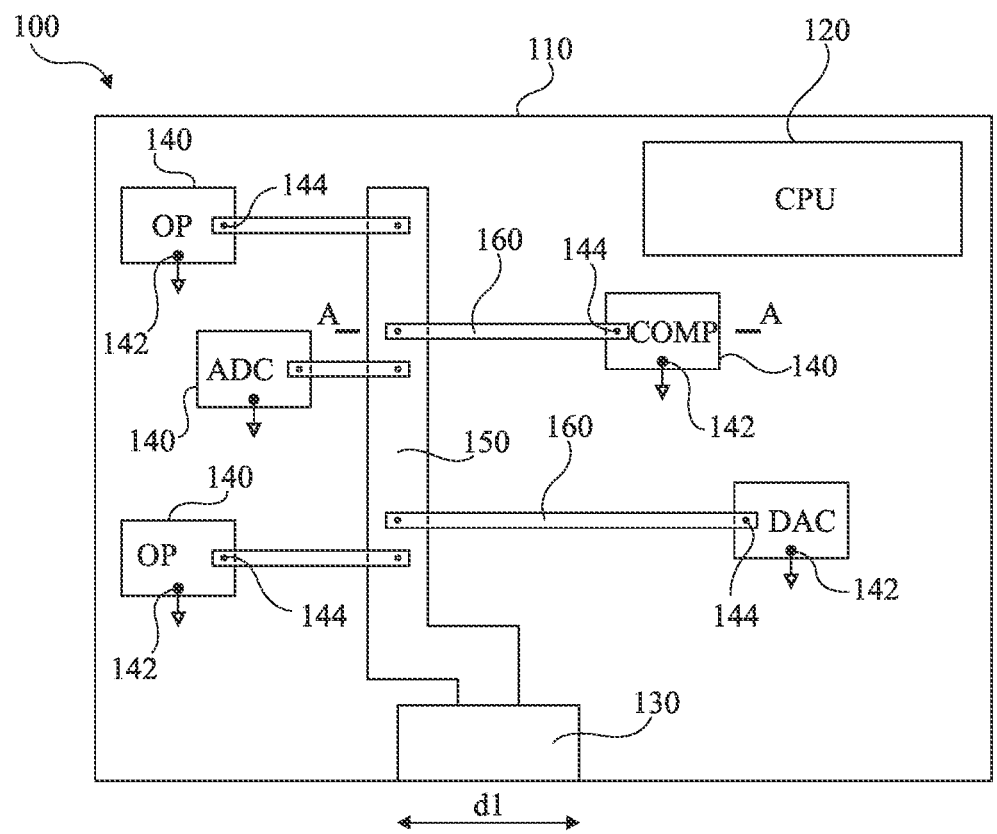
FIG. 1 shows a schematic top view of an embodiment of an electronic chip.

FIG. 1 shows a schematic top view of an embodiment of an electronic chip 100. FIG. 2 schematically shows a sectional view (section plane A-A) of the chip of FIG. 1, on a different scale from that of FIG. 1.

The chip 100 may be made up of a substrate 110 such as a semiconductor wafer portion, and elements located on the substrate 110. These elements comprise circuits formed in and on the wafer (front face side, that is to say, face oriented toward the front in FIG. 1 and upper face in FIG. 2). The chip 100 is preferably a chip of the SOC (System On Chip) type. SOC-type chips are in particular used in embedded or mobile applications, such as mobile telephones, connected objects, electrical appliances or transport. Preferably, the chip 100 is intended to be arranged in an integrated circuit housing (not shown). The housing is preferably intended to be connected, for example soldered or welded, for example ultrasonically, to an outside electronic device such as a printed circuit of the PCB (Printed Circuit Board) type.

Preferably, the chip 100 comprises a set 120 of digital circuits. The set 120 typically comprises at least one sequential data processing unit, for example of the microprocessor (CPU) type, and various peripherals such as memories and/or digital communication interfaces.

The electronic chip 100 comprises connection pads. As an example, FIG. 1 shows a single pad 130. However, the chip preferably comprises several connection pads. The connection pads are typically formed by conductive areas, for example metallic areas, located on the front face of the chip 100. The pads, for example, have a same rectangular or square shape, or even octagonal. The pads preferably have a length per side dl of between 50 μm and 150 μm. As an example, the length dl is considered parallel to the edge of the chip closest to the considered pad 130. The length dl can also be considered orthogonally to this edge, and the pad 130 can then comprise several portions having different widths. Preferably, the pads 130 are located at more than 40 μm from the edges of the chip. The connection pads are connectable to circuits outside the chip, preferably to the housing in which the chip is intended to be arranged. The pads are preferably connectable by soldering or welding, for example ultrasonically, for example to pins of the housing. These pins are intended to be soldered or welded to a device outside the housing.

The electronic chip 100 further comprises electronic circuits 140. Each electronic circuit 140 is defined by several components, such as transistors and/or diodes and/or capacitors and/or resistors, etc., not shown, and by links linking these components to one another and/or to nodes. For each electronic circuit 140, at least two of the nodes of the electronic circuit 140 (nodes 142, 144) are nodes for applying fixed potentials. A fixed, or continuous, potential is defined by a potential kept at a constant level when the device is operating. During operation, the electronic circuits 140 receive fixed potentials on the nodes 142 and 144. For example, the nodes 142 and 144 are nodes for applying a direct supply voltage of the circuit.

Preferably, each electronic circuit 140 comprises input and/or output nodes (not shown). The circuit 140 is then configured to perform a given function from signals applied on the input nodes. Such a function is typically to produce one or several signals on one or several output nodes and/or, for example, to modify the state of a memory inside the circuit.

Preferably, each of the circuits is at least partially analog, that is to say, the circuit is configured to receive and/or produce at least one analog signal and/or to use an analog signal inside the circuit. An analog signal is a signal able to assume a continuous set of values in a given range, for example a set of voltage or current values applied to a node. Each circuit is then preferably configured to compare an analog value to a threshold (comparator circuit COMP), and/or to amplify a gap between analog values (amplifier circuit, preferably operational amplifier OP), and/or to convert an analog value into a digital value (Analog-Digital Converter ADC), and/or to convert a digital value into an analog converter (Digital-Analog Converter DAC).

Preferably, each of the electronic circuits 140 comprises, for example, a circuit of the intellectual property core or IP core type. Indeed, to design the electronic chip, a computer-assisted design method is implemented, typically using a library of design cores. Each core defines an electronic component or a set of components and connections between these components. During the design, connections between the cores are defined. An IP core is then defined by an electronic circuit, which, during the design of the chip, corresponds to a design core.

The chip comprises a shared strip 150 that is at least partially conductive, that is to say, containing an electrically conductive material. The strip is defined by a structure having a direction of elongation, this structure being electrically conductive at least in the direction of elongation. The electronic circuits 140 are linked, preferably connected, to the shared strip 150 by conductive tracks 160. More specifically, several circuits among the electronic circuits 140 each have their node 144 linked, preferably connected, by a track 160 to the conductive material of the shared strip. For example, at least five electronic circuits 140, preferably more than ten electronic circuits 140, are linked, for example connected, to the same strip 150.

Preferably, the shared strip 150 has a ratio between length (dimension in the direction of elongation) and width (transverse dimension parallel to the front face) greater than 2, more preferably greater than 10, for example greater than 50. The shared strip 150 can be completely straight or be a straight part of a more extended structure than the strip 150. For example, the shared strip is part of a longer strip having one or several curves and/or one or several angles, preferably one or several right angles. In a variant, the shared strip has one or several curves and/or one or several angles. For example, the shared strip has one or several right angles, and the tracks 160 can be connected to different straight portions of the shared strip 150.

The shared strip 150 is linked, preferably connected, to a node for applying a fixed potential. Preferably, as shown, this node for applying a fixed potential comprises, or is formed by, the pad 130.

During operation, this makes it possible to apply the same fixed potential simultaneously to the circuits 140 linked to the common strip 150. In the illustrated example, the fixed potential of the pad 130 is applied to the node 144 of each of the electronic circuits 140.

In the example where the nodes 144 and 142 are nodes for applying a supply voltage referenced relative to the ground, the nodes 142 can be linked, preferably connected, to the ground. The circuits 140 are supplied by the simple application of the supply voltage between the ground and the pad 130. The links between the nodes 142 and the ground can be formed by any standard links between several nodes and the ground. However, the links between the nodes 142 and the ground are preferably formed by conductive tracks that are linked, preferably connected, to another shared strip, not shown.

This example is not limiting, the nodes 144 and 142 being able to be nodes for applying any shared fixed potential to several circuits. Furthermore, nodes other than the nodes 142 and/or 144 of several circuits 140 can be linked, preferably connected, to one or several other shared strips. Each circuit 140 can then not be linked to any shared strip, be linked to a single shared strip, or be linked to several shared strips.

It may have been considered to link each of the nodes 144 by a link directly connected to the pad 130, without the intermediary of the shared strip 150. One would then have been led to connect a large number of tracks, typically more than five tracks, or even more than ten tracks, directly to the pad 130.

In comparison, providing the shared strip 150 makes it possible to simplify the design of the links between the nodes 144 and a same node (here the pad 130). To that end, preferably, the tracks 160 are designed after designing the shared strip 150. In particular, it is easily possible to reduce the surface occupied by the tracks and the strip 150 relative to the surface occupied by tracks connected directly to the node 130.

Preferably, the shared strip 150 has an electrical resistance per unit of length lower than those of the tracks 160. Preferably, for each track, the strip has an electrical resistance per unit of length lower than 20%, preferably lower than 10% of that of each track. As an example, the total electrical resistance of the shared strip 150 and of its connection to the pad 130 (or to a node for applying the potential of the pad 130) is less than 10Ω, preferably less than 1Ω, more preferably less than 0.1Ω. Thus reducing the electrical resistance of the shared strip 150 makes it possible to reduce the stray interactions between the circuits 140, for example variations of the supply voltage of one of the circuits 140 when the current consumed by another one of the circuits 140 varies. In other words, the resistance of the shared strip 150 is low enough so that, during operation, the potential is substantially constant or uniform in the entire strip 150. For example, the total resistance (sum of the resistances) of the shared strip 150 and its connection to the pad is low enough that, during operation, the potential is, in the entire shared strip 150, equal to that of the pad 130 to within 10%, preferably to within 5%, of an operating allowance interval of each circuit 140 for the potential applied to its node 144. This, in particular, makes it possible to reduce the noise level in the signals produced by the circuits 140, which corresponds to an improvement in the operation of the chip.

Preferably, each of the tracks 160 links connects a single one of the electronic circuits 140 to the shared strip 150. Due to the low resistance value, defined above, of the shared strip 150 and, preferably, of its connection to the pad 130, the entire strip, during operation, serves as a node for applying the fixed potential to the pad 130. Thus, the circuits 140 are linked, preferably connected, to this node in a star. This makes it possible to prevent stray interactions from being produced among several circuits connected to a same track, for example following variations in current consumed by one of the circuits. Providing, during the design of the chip, such connections in a star thus make it possible to ensure that during operation, the noise and disruption levels among circuits are low enough to avoid risk of incorrect operation or failure of the chip. As mentioned above, relative to star connections with no shared strip like the strip 150, the star connections comprising the shared strip 150 are simpler to produce and can take up a smaller surface.

Preferably, the shared strip 150 is located in metal levels of the electronic chip 100, that is to say, in layers 210 (shown in dotted lines in part of FIG. 2) comprising metal regions 212 surrounded by electrical insulation 214 and comprised between electrically insulating layers 220 covering the front face of the chip. In one example, not shown, the shared strip 150 comprises a metallic region in the form of a strip or tape, that is to say, a metal strip, situated in a single level of metal 210.

Preferably, each conductive track 160 comprises a metal strip 212B located in a single level of metal 210. In a variant, each track 160 can comprise several parallel metal strips, preferably located in a same metal level 210. Preferably, each conductive track 160 is located in a different metal level from those of the shared strip 150 and is connected to the conductive strip by vias 230. Each via is defined by a conductive element, preferably metallic, passing through one or several insulating layers 220, and linking, preferably connecting, metallic regions 212 located at different metal layers. More preferably, the conductive tracks 160 linked to the same shared strip 150 are located in a same metal level 210. Each track 160 is connected to a metallic region defining the node 144 of the concerned circuit 140. In a variant, the node 144 corresponds to a portion, for example an end portion, of the track 160.

Preferably, the shared strip 150 comprises several metallic strips 212A, more preferably parallel to one another. In the illustrated example, the shared strip 150 comprises six metal strips 212A. The metal strips 212A are for example linked, preferably connected, to the connection pad 130. The link or connection between the metallic strips and the connection pad can be direct, or by conductive vias and/or conductive tracks.

Preferably, the sum of the widths of the metal strips 212A is greater than the width of the tracks 160 and/or the sum of the thicknesses of the metal strips 212A is greater than that of each track 160. As a result, the surface of the conductive section of the shared strip 150, that is to say, the surface occupied, in a cross-section of the shared strip 150 (plane of FIG. 2), by the conductive material of the shared strip 150, is several times that of the metal strips 212A. The surface of conductive section of the shared strip 150 is thus greater than that of the tracks 160, which makes it possible, for example in the case of metal strips 212A and tracks 160 made from a same metal, to obtain a lower resistance per unit of length for the conductive strip 160 than for the tracks.

As an example, each track 160 has a width of between 2 and 35 µm, preferably equal to 20 µm. The metallic strips 212A for example have widths of between 2 and 35 µm, preferably equal to 12 µm. As an example, the shared strip 150 has, seen from above, between opposite edges of the set of metallic strips 212A, a width of between 30 and 150 µm. The thickness of each track 160 and of each metallic strip is for example between 0.8 and 3.4 µm.

The shared strip 150 can, in cross-section, assume any suitable cross-section shape having a surface larger than that of the conductive section of the tracks 160. However, providing that the shared strip 150 is formed by several conductive strips 212A, this makes it possible to use, in order to form the strip 150, metallic strips 212A having a width and thickness that are easily compatible with the typical methods for designing and producing metallic strips in insulating layers of an electronic chip. Thus, relative to a shared strip 150 formed by a single metallic strip, the shared strip 150 comprising several metallic strips 212A makes it possible more easily to obtain the low resistance value, as defined above, of the shared strip 150.

Preferably, in the shared strip 150 formed by several metallic strips, the adjacent metallic strips of a same level of metal are separated by a distance d smaller than the width of the metallic strips 212A, more preferably smaller than 30% of the width of the metallic strips 212A. As an example, the distance d is between 2 and 5 µm, for example equal to 3.5 µm. Reducing the distance d makes it possible to reduce the surface area occupied by the shared strip 150.

In the illustrated example, the metallic strips 212A of the shared strip 150 are located in different metal levels 210 and are more preferably at least partially superimposed. Relative to non-superimposed metallic strips 212A, this makes it possible to reduce the surface area occupied by the shared strip 150. Preferably, the superimposed metallic strips 212A are connected to one another by vias 230A. As an example, the vias 230A are superimposed on the connecting vias 230 between the shared strip 150 and the tracks 160. During operation, the vias 230A make it possible to equalize the potential within the strip 150, which, as was mentioned above, improves the operation of the chip.

In one preferred example, the metallic strips 212A of the shared strip 150 are located in the same metal level. The vias 230A are then omitted. This shared metal level is preferably that for which the metal is most conductive among the metals of the metal levels. Thus, the metallic strips 212A are made from a material that is more conductive than that of the tracks 160. As an example, this shared metal level is higher, that is to say, further from the substrate 110, than that of the tracks 160.

Providing that the shared strip 150 is formed by a metallic strip made from a metal that is more conductive than that of the tracks 160, or that at least some of the metallic strips 212A of the strip 150 are made from a material that is more conductive than that of the tracks 160, it is possible, for a same conductive section surface of the strip 150 and of the tracks 160, to obtain a lower resistance per unit of length for the shared strip 150 than for the tracks 160. This can be combined with a conductive section of the shared strip 150 larger than that of the tracks 160, which makes it possible to further reduce the resistance ratio between that of the strip 150 and that of the tracks 160. As was mentioned above, one thus improves the operation of the chip.

As an example, the metallic strip(s) 212A of the shared strip 150 are made from copper, and the tracks 160 are made from aluminum. In a variant, the tracks 160 can comprise metals that are more conductive than that or those of the metallic strips, for example the metallic strip(s) 212A are made from aluminum, and the tracks 160 are made from copper. In variants, the tracks 160 comprise several different metals and/or the metallic strips 212A comprise several different metals.

According to one embodiment, the shared strip 150 is located in a same metal level as the pad 130, or at least some of the metallic strips 212A are located in a same metal level as the pad 130. The shared strip 150 can then form, at least in part, an extension of the pad 130, that is to say, the pad 130 and at least part of the shared strip 150 are formed by a same metallic region made from a same material.

According to one embodiment, the shared strip 150 can be located in one or several metal levels different from that or those of the pad 130, or at least some of the metallic strips 212A are located at metal levels different from that or those of the pad 130. The shared strip can then be linked to the pad 130 by vias.

According to one embodiment, the shared strip 150 is connected to the pad 130 by metallic regions 212 of the metal levels 210. These regions can be located in one or several metal levels different from those of the shared strip and/or of the pad 130. These regions can then be connected by vias to the pad 130 and/or to the shared strip 150.

Figure 3:
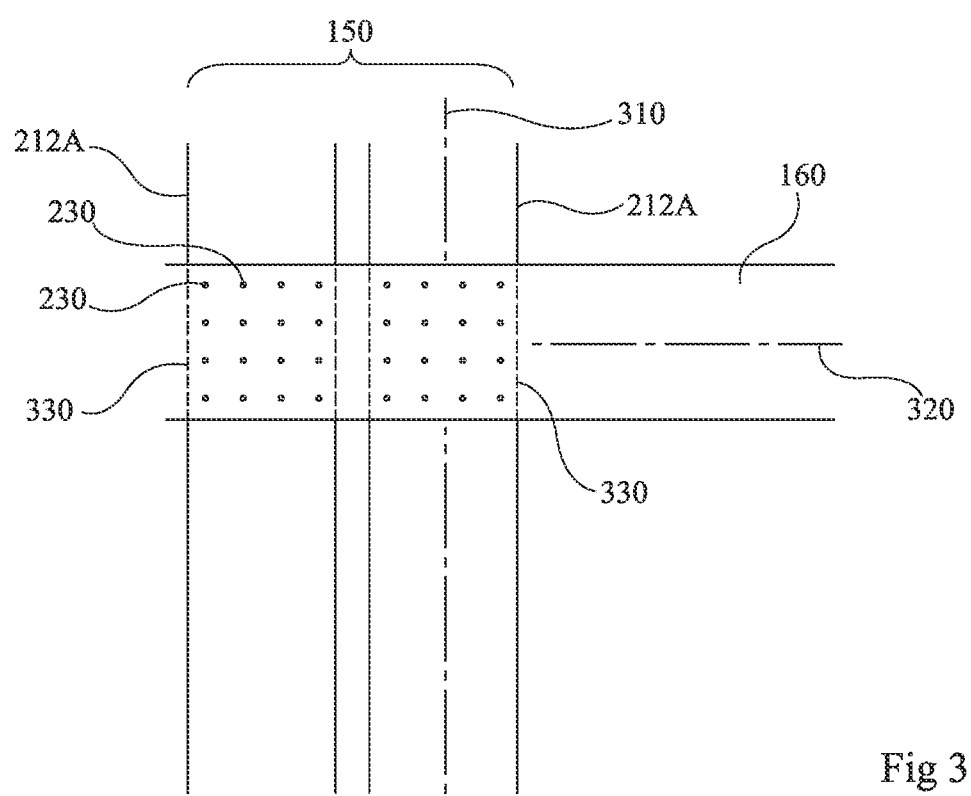
FIG. 3 shows a top view, on a different scale, of an example of a part of the chip of FIG. 1.

FIG. 3 shows a top view, on a scale different from that of FIG. 1, of an example of a part of the chip of FIG. 1. More specifically, FIG. 3 shows a connection between the shared strip 150 and one of the tracks 160. In this example, the shared strip 150 comprises two metallic strips 212A, but the strip 150 can comprise a different number of metallic strips 212A.

In the illustrated example, the tracks 160 depart from the shared strip 150 orthogonally thereto. In other words, the shared strip 150 has a longitudinal direction 310, or main direction or direction of elongation, and the track 160 has a longitudinal direction 320 orthogonal to the longitudinal direction 310 of the shared strip 150. More specifically, the longitudinal directions 310 and 320 are those of parts relatively close to the contact shown between the shared strip 150 and the track 160, the shared strip 150 and/or the track 160 being able to change directions in parts relatively far away from this contact. The part of the track 160 close to the contact is preferably an end portion of the track 160. This example is not limiting, and the angle between the directions 310 and 320 can be different from 90°. However, the fact that the tracks depart orthogonally to the shared strip makes it possible to facilitate the design and the production of the tracks 160 and of the shared strip 150, relative to angles different from 90° between the directions 320 and 310.

For each metallic strip 212A, parts 330 of the track 160 and of the metallic strip 212A are superimposed. The superimposed parts have a rectangular shape seen from above. The positions of the vias 230, located between the track 160 and the metallic strips 212A, have been shown.

Preferably, several vias 230 are present between each metallic strip 212A and the track 160, for example two, four, eight, twelve or sixteen vias. The vias are preferably arranged in a matrix. The connection between each metallic strip 212A and the track 160 thus has a lower resistance than with a single via 230. One would thus be able to use a single via having a width (or dimensions in the directions parallel to the front face of the chip) larger than that of the vias 230. However, the standard methods for designing and manufacturing vias are easier to implement for several vias 230, particularly when they are arranged in a matrix, than for a single via wider than the vias 230. As an example, the vias have a width of between 0.36 and 3 µm.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. An electronic chip, comprising:
a shared strip that is at least partially conductive and is linked to a node for applying a fixed potential,
wherein the shared strip is electrically conductive along a direction of elongation and has at least one curve or angle along the direction of elongation, and
wherein the shared strip comprises a plurality of metallic strips, wherein metallic strips that are adjacent and side by side are separated by a distance smaller than a width of the metallic strips.

2. The electronic chip of claim 1, wherein the shared strip is electrically conductive along the direction of elongation; and wherein the shared strip has a ratio of length to width greater than 50, the length being along the direction of elongation, the width being orthogonal to the direction of elongation.

3. The electronic chip of claim 1, wherein the shared strip is electrically conductive along the direction of elongation; and wherein the shared strip has a ratio of length to width greater than 10, the length being along the direction of elongation, the width being orthogonal to the direction of elongation.

4. The electronic chip of claim 1, wherein the shared strip is electrically conductive along the direction of elongation; and wherein the shared strip has a ratio of length to width greater than 2, the length being along the direction of elongation, the width being orthogonal to the direction of elongation.

5. The electronic chip of claim 1, wherein the shared strip is electrically conductive along the direction of elongation; wherein the shared strip is devoid of curves or angles along the direction of elongation.

6. The electronic chip of claim 1, wherein the shared strip is electrically conductive along the direction of elongation; wherein the shared strip is formed by a first portion extending along the direction of elongation, a second portion extending along the direction of elongation, and an intermediate connection portion connecting the first portion to the second portion, the intermediate connection portion being orthogonal to the direction of elongation.

7. The electronic chip of claim 1, wherein said node is defined by a connection pad of the electronic chip.

8. The electronic chip of claim 1, further comprising a plurality of tracks extending from the shared strip, with a resistance per unit length of the shared strip being lower than a resistance per unit length of the plurality of tracks.

9. The electronic chip of claim 8, wherein the plurality of tracks are located in a different layer than the shared strip and connected to the shared strip by vias.

10. The electronic chip of claim 9, wherein the distance is less than 30% of the width of the plurality of metallic strips.

11. The electronic chip of claim 8, wherein a sum of widths of the plurality of metallic strips comprising the shared strip is greater than a width of the tracks.

12. An electronic chip, comprising:
a shared strip that is at least partially conductive and is linked to a node for applying a fixed potential, wherein the shared strip comprises a plurality of metallic strips, wherein metallic strips that are adjacent and side by side are separated by a distance smaller than a width of the metallic strips; and
a plurality of tracks extending from the shared strip, with a resistance per unit length of the shared strip being lower than a resistance per unit length of the plurality of tracks;
wherein a sum of thicknesses of the plurality of metallic strips comprising the shared strip is greater than that of each track.

13. The electronic chip of claim 12, wherein the shared strip is electrically conductive along a direction of elongation; and wherein the shared strip has a ratio of length to width greater than 50, the length being along the direction of elongation, the width being orthogonal to the direction of elongation.

14. The electronic chip of claim 12, wherein the shared strip is electrically conductive along a direction of elongation; and wherein the shared strip has a ratio of length to width greater than 10, the length being along the direction of elongation, the width being orthogonal to the direction of elongation.

15. The electronic chip of claim 12, wherein the shared strip is electrically conductive along a direction of elongation; and wherein the shared strip has a ratio of length to width greater than 2, the length being along the direction of elongation, the width being orthogonal to the direction of elongation.

16. The electronic chip of claim 12, wherein the shared strip is electrically conductive along a direction of elongation; wherein the shared strip is devoid of curves or angles along the direction of elongation.

17. The electronic chip of claim 12, wherein the shared strip is electrically conductive along a direction of elongation; wherein the shared strip is formed by a first portion extending along the direction of elongation, a second portion extending along the direction of elongation, and an intermediate connection portion connecting the first portion to the second portion, the intermediate connection portion being orthogonal to the direction of elongation.

18. The electronic chip of claim 12, wherein said node is defined by a connection pad of the electronic chip.

19. An electronic chip, comprising:
a shared strip that is at least partially conductive and is linked to a node for applying a fixed potential, wherein the shared strip comprises a plurality of metallic strips;
wherein metallic strips that are adjacent and side by side are separated by a distance smaller than a width of the metallic strips; and
wherein at least some of the plurality of metallic strips are located in different metal levels and at least partially superimposed and connected by vias.

20. The electronic chip of claim 19, wherein the shared strip is electrically conductive along a direction of elongation; and wherein the shared strip has a ratio of length to width greater than 50, the length being along the direction of elongation, the width being orthogonal to the direction of elongation.

21. The electronic chip of claim 19, wherein the shared strip is electrically conductive along a direction of elongation; and wherein the shared strip has a ratio of length to width greater than 10, the length being along the direction of elongation, the width being orthogonal to the direction of elongation.

22. The electronic chip of claim 19, wherein the shared strip is electrically conductive along a direction of elongation; and wherein the shared strip has a ratio of length to width greater than 2, the length being along the direction of elongation, the width being orthogonal to the direction of elongation.

23. The electronic chip of claim 19, wherein the shared strip is electrically conductive along a direction of elongation; wherein the shared strip is devoid of curves or angles along the direction of elongation.

24. The electronic chip of claim 19, wherein the shared strip is electrically conductive along a direction of elongation; wherein the shared strip is formed by a first portion extending along the direction of elongation, a second portion extending along the direction of elongation, and an intermediate connection portion connecting the first portion to the second portion, the intermediate connection portion being orthogonal to the direction of elongation.

25. The electronic chip of claim 19, wherein said node is defined by a connection pad of the electronic chip.

26. An electronic chip, comprising:
a shared strip comprising a first portion extending along a direction of elongation, a second portion extending along the direction of elongation and laterally spaced apart from the first portion, and an intermediate connecting portion extending between the first portion and second portion; and
a pad to which the second portion is connected, the pad having a greater surface area than the second portion;
wherein the first portion is comprised of a first plurality of metallic strips, wherein metallic strips of the first plurality of metallic strips that are adjacent and side by side are separated by a distance smaller than a width of those metallic strips; and
wherein the second portion is comprised of a second plurality of metallic strips, wherein metallic strips of the second plurality of metallic strips that are adjacent and side by side are separated by a distance smaller than a width of those metallic strips.

27. The electronic chip of claim 26, wherein the intermediate connecting portion extends orthogonally to the direction of elongation.

28. The electronic chip of claim 27, wherein the shared strip has a ratio of length to width greater than 2.

29. The electronic chip of claim 26, further comprising a plurality of tracks extending from the shared strip, with a resistance per unit length of the shared strip being lower than a resistance per unit length of the plurality of tracks.

30. The electronic chip of claim 29, wherein the plurality of tracks are located in a different layer than the shared strip and connected to the shared strip by vias.

31. The electronic chip of claim 26, wherein at least some of the first plurality of metallic strips are located in different metal levels and at least partially superimposed and connected by vias; wherein at least some of the second plurality of metallic strips are located in different metal levels and at least partially superimposed and connected by vias.

* * * * *